United States Patent [19]

Matsuda et al.

[11] Patent Number: 5,371,714

[45] Date of Patent: * Dec. 6, 1994

[54] METHOD AND APPARATUS FOR DRIVING WORD LINE IN BLOCK ACCESS MEMORY

[75] Inventors: Yoshio Matsuda; Kazuyasu Fujishima; Hideto Hidaka, all of Hyogo, Japan

[73] Assignee: Mitsubishi Denki Kabushiki Kaisha, Tokyo, Japan

[*] Notice: The portion of the term of this patent subsequent to Jan. 22, 2010 has been disclaimed.

[21] Appl. No.: 26,225

[22] Filed: Feb. 26, 1993

Related U.S. Application Data

[63] Continuation of Ser. No. 566,809, Aug. 13, 1990, Pat. No. 5,222,047, which is a continuation of Ser. No. 195,675, May 13, 1988, abandoned.

[30] Foreign Application Priority Data

May 15, 1987 [JP] Japan .................. 62-119212

[51] Int. Cl.⁵ .............................................. G11C 8/00
[52] U.S. Cl. .................... 365/230.03; 365/239; 365/230.06; 365/233
[58] Field of Search ............. 365/221, 239, 230.3, 365/230.06, 227, 233, 194

[56] References Cited

U.S. PATENT DOCUMENTS

| 3,500,340 | 3/1970 | Koerner et al. | 365/239 |
|---|---|---|---|
| 3,851,313 | 11/1974 | Chang | 365/239 |
| 4,044,339 | 8/1977 | Berg | 365/240 |
| 4,541,075 | 9/1985 | Dill et al. | 365/219 X |
| 4,581,720 | 4/1986 | Takemae et al. | 365/222 |
| 4,596,003 | 6/1986 | Shimizu | 365/230.03 |
| 4,636,982 | 1/1987 | Takemae et al. | 365/230.06 X |
| 4,719,603 | 1/1988 | Shinagawa et al. | 365/230.06 |
| 4,747,083 | 5/1988 | Nakajima et al. | 365/230.06 |
| 4,777,625 | 10/1988 | Sakui et al. | 365/227 X |
| 4,783,767 | 11/1988 | Hamada | 365/230.03 X |
| 4,796,234 | 1/1989 | Itoh et al. | 365/63 X |
| 4,802,134 | 1/1989 | Tsujimoto | 365/239 X |
| 4,813,021 | 3/1989 | Kai et al. | 365/194 |
| 4,829,485 | 5/1989 | Hatanaka et al. | 365/239 |
| 5,083,294 | 1/1992 | Okajima | 365/230.03 X |
| 5,222,047 | 6/1993 | Matsuda et al. | 365/230.03 |

FOREIGN PATENT DOCUMENTS 58-94187  6/1983  Japan .................. 365/230.06

OTHER PUBLICATIONS

Raymond Pinkham et al., "A High Speed Dual Port Memory With Simultaneous Serial and Random Mode Access for Video Applications", IEEE Journal of Solid-State Circuits, vol. SC-19, No. 6, Dec. 1984, pp. 999–1007.

Primary Examiner—Andrew L. Sniezek
Attorney, Agent, or Firm—Lowe, Price, LeBlanc & Becker

[57] ABSTRACT

In a block access memory in which the memory cell array is divided into a plurality of blocks and data input/output is carried out by block unit, each block is divided into a plurality of subblocks, and the timing of activating the word line and the timing of activating the sense amplifier are made different for each subblock in the block in which the selected word line is included, whereby the peak current associated with the bit line charge/discharge at the time of activating the sense amplifiers is reduced.

4 Claims, 6 Drawing Sheets

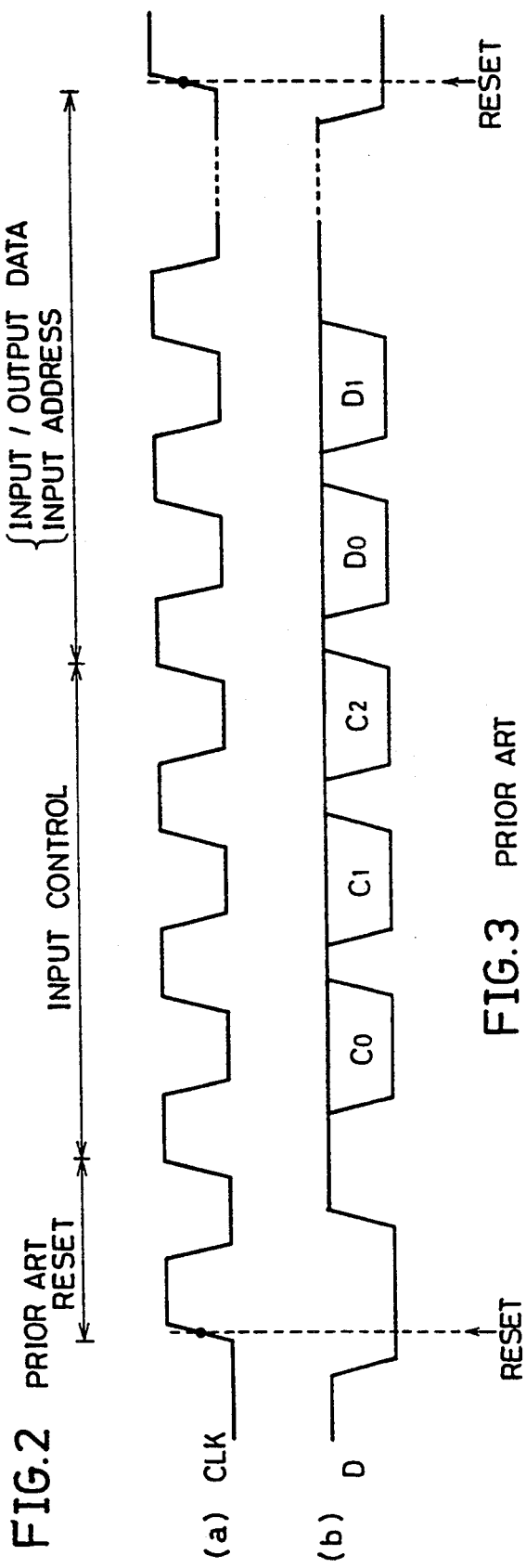

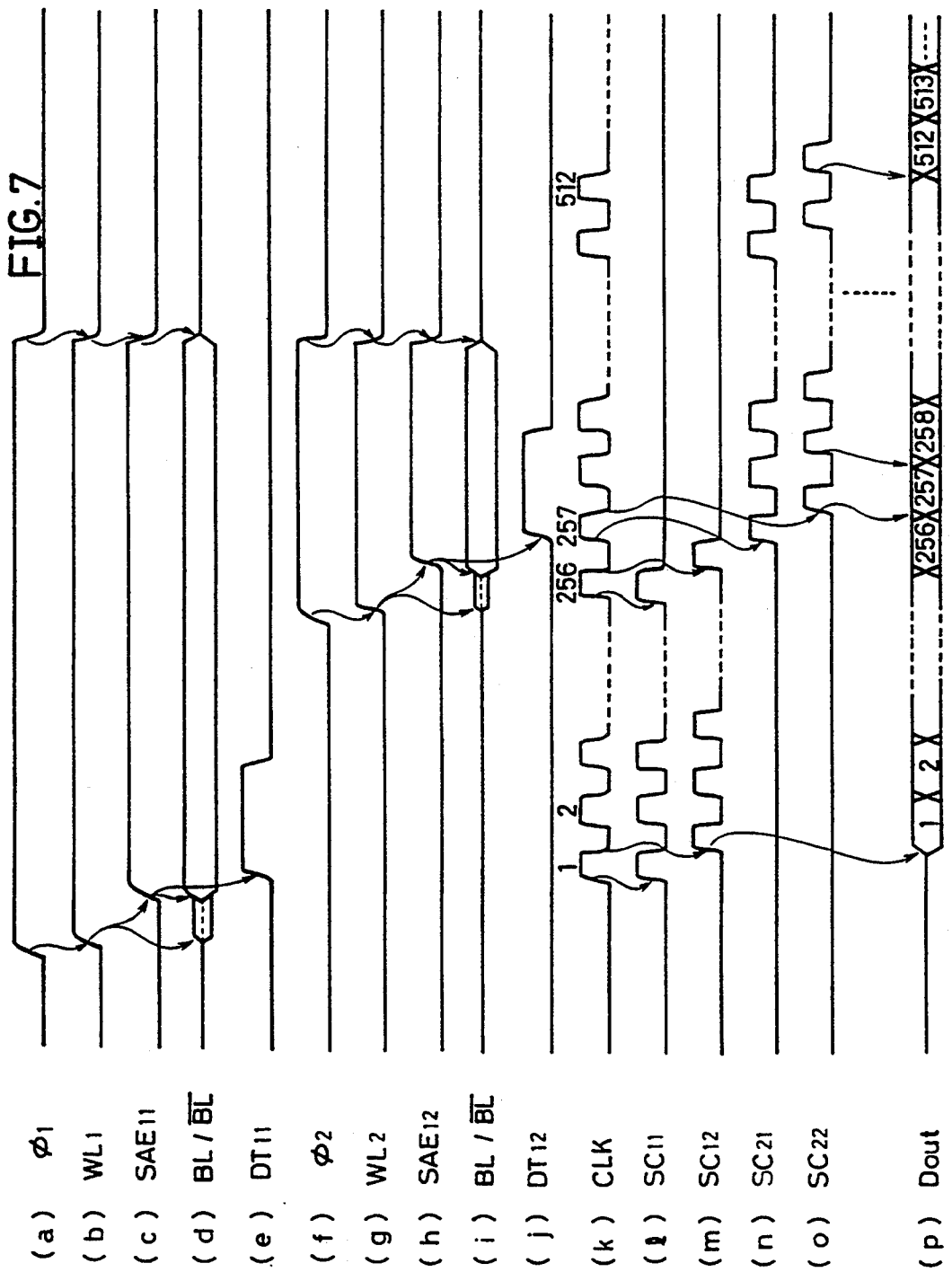

METHOD AND APPARATUS FOR DRIVING WORD LINE IN BLOCK ACCESS MEMORY

This application is a continuation of application Ser. No. 07/566,809 filed Aug. 13, 1990 and allowed Jan. 6, 1993 now U.S. Pat. No. 5,222,047 which is a continuation of application Ser. No. 07/195,675 now abandoned.

BACKGROUND OF THE INVENTION

1. Field of the Invention

The present invention relates to an accessing scheme in a block access memory and, more specifically, it relates to a method and apparatus for driving a word line in a block access memory which is accessed by block unit.

2. Description of the Prior Art

Recently, in a large capacity MOS RAM (random access memory constituted by MOS transistors), as it comes to be implemented in higher integration, it has been desired to enhance the data input/output rate. The method for enhancing the data input/output rate is mainly constituted by the following two methods.

(1) The data input/out rate is increased by making the MOS RAM with multi bit structure. In this case, the degree of integration is sacrificed both in the chip level and the package level due to the increase of the area of the portions for the parallel operation in the chip and to the increase of the number of the terminals in the package.

(2) Multi bits are serially inputted/outputted at high speed by providing shift registers respectively at the data input/output portions. In this case, the disadvantages shown in the above described method (1) can be eliminated except the increase of the chip area by the arrangement of the shift registers.

In order to draw much advantage from the method (2), the following method is proposed.

(2') The number of the terminals in the package is reduced by serially inputting control signals from one terminal and by serially carrying out address input and data input/output at one terminal.

By incorporating the methods (2) and (2'), the packaging density can be significantly enhanced and the data input/output can be carried out at high speed.

FIG. 1 shows a schematic structure of the above described semiconductor memory device in which address input and data input/output are carried out serially through one terminal. In FIG. 1, a data input/output terminal 1, a clock input terminal 2, a supply terminal 3 to which the supply voltage Vcc is applied, and a ground terminal 4 which is connected to the ground potential Vss are provided as the external terminals (terminals which are connected to the external circuits). The data input/output terminal 1 receives a write data input to the memory cells provided in the device, a read data output from the memory cells, a row address input and a control for designating the operation mode. The clock input terminal 2 receives a clock signal CLK for providing the operation timing of each of the portions in the device.

The memory cell array storing the information is divided into a plurality of blocks (four blocks in FIG. 1) B1, B2, B3 and B4. In each of the blocks B1 to B4, provided are a plurality of memory cells MC arranged in rows and columns each of which storing information, a plurality of word lines WL for selecting one row of the plurality of memory cells MC and a plurality of bit lines BL to which one column of the plurality of memory cells MC is connected. In FIG. 1, only one word line WL and one bit line BL are shown for the simplification of the drawing. The two bit lines shown in the figure illustrate that the bit line has the folded bit line structure and is constituted by a bit line pair on which complementary information appears. Each memory cell MC usually has the structure of one transistor and one capacitor. Corresponding to each of the memory blocks B1 to B4, sense amplifiers SA1, SA2, SA3 and SA4 are provided for detecting and amplifying the potential on the bit line which appears dependent on the information contained in the selected memory cell. The sense amplifiers SA1 to SA4 also has the function of data latch and, in addition, the sense amplifiers carry out the refresh operation of each memory cell.

In order to select one word line in response to externally applied address signals, a row decoder RD1 is provided for the blocks B1 and B2 while a row decoder RD2 is provided for the blocks B3 and B4.

A block selector for selecting one of the blocks B1 to B4 and an I/O shift register for reading/writing data into/from the block selected by the block selector are provided for carrying out data input/output. In FIG. 1, the block selector and the I/O shift register are shown as one structure block 5.

As the data input/output path, provided are a data output buffer 6 which receives the information contained in the memory cells selected by an external address through the block selector +I/O shift register 5 and transmits the same to the serial/parallel conversion circuit 10; a data input buffer 7; which serially receives the serial data applied from the data input/output terminal 1 through the serial/parallel conversion circuit 10 and transmits the same to the block selector +I/O shift register 5; a control signal generation circuit 8 which receives a control applied through the data input/output terminal 1 through the serial/parallel conversion circuit 10 and generates a block selection signal, a sense amplifier activating signal, a data output buffer activating signal, a data input buffer activating signal, a row decoder activating signal and a row address buffer activating signal; a row address buffer 9 which receives a row address applied through the data input/output terminal 1 through the serial/parallel conversion circuit 10 in parallel and transmits the same to the row decoders RD1 and RD2; and a serial/parallel conversion circuit 10 which operates in response to a clock signal CLK applied through the clock input terminal 2, serially receives a signal applied from the data input/output terminal 1 and applies in parallel the same to the data input buffer 7, the control signal generation circuit 8 or to the row address buffer 9 and which transmits the read data from the data output buffer 6 to the data input/output terminal 1 as the output data.

In FIG. 1, each of the blocks B1 to B4 has a capacity of 256k bits of 256 row×1024 column, as an example.

The operation will be briefly described. The external row address applied through the data input/output terminal 1 is applied to the row address buffer 9 through the serial/parallel conversion circuit 10 and is applied to the row decoders RD1 and RD2 under the control of the control signal generation circuit 8. In the row decoders RD1 and RD2, the unit row decoder designated by the row address is selected out of the unit row decoders included in the row decoders RD1 and RD2 in response to the applied row address, and the word line connected to the selected unit row decoder is activated and the potential of the selected word line rises. Consequently, the stored data contained in the memory cell group (for one row) connected to the selected word line respectively appear on the bit line as the signal potential. The signal potential appeared on the bit line is detected and amplified by a sense amplifier which is activated in response to the control signal from the control signal generation circuit 8. As a result, the potential corresponding to the information "1" or "0" contained in the memory cell connected to the selected word line is established in each bit line. On this occasion, the sense amplifiers are activated only in the block to which the selected word line belongs.

In reading data, the read data, which are detected and amplified by the sense amplifier of the block to which the selected word line belongs out of the sense amplifiers SA1 to SA4, are transmitted and latched at the shift register provided corresponding to the blocks. Thereafter, one block is selected in response to a block select signal generated by the control signal generation circuit 8, the shift register corresponding to that block is activated and the data latched in the shift register are serially read according to the shifting operation of the activated shift register, and are outputted serially as the output data through the data output buffer 6, serial/parallel converting circuit 10 and the data input/output terminal 1. In data writing, in the reverse manner, the serial data stream applied through the data input/output terminal 1 is applied to the data input buffer 7 through the serial/parallel conversion circuit 10 and then is transmitted to the shift register provided corresponding to the block selected by the block selection signal and is latched therein. Thereafter, latched information is applied from this shift register to the bit lines through the activated sense amplifier and is written in the corresponding memory cells.

FIG. 2 is a diagram of waveforms showing the operation timing of the block access memory shown in FIG. 1. In FIG. 1, the operation timing for a certain 1 cycle is illustrated. Now, 1 cycle means the period from the reset operation to the next reset operation, and the reset operation is carried out if the data input/output terminal 1 is at "L" when the clock CLK input rises. When the reset operation is carried out, the memory cell array, the shift register and the serial/parallel conversion circuit 10 are reset (initialized). After completion of the reset operation, as long as the signal level at the data input/output terminal 1 is "H" level when the clock CLK rises, a certain operation cycle is continuously carried out and either control input, row address input, data input or data output is carried out through the data input/output terminal 1 when the clock CLK falls.

FIG. 3 is a table showing the relation between the operation mode and the control designating the operation of each operation cycle.

The 3 bit input (C0, C1, C2) applied at the start of each cycle is a control input and designates the basic operation of the succeeding cycle. The basic operation is defined as shown in FIG. 3, namely, (1) row address set: the cycle in which following the 3 bit control input cycle, a row address is inputted on which an operation cycle designated by the control is carried out;

(2) read/refresh: the cycle in which detection and amplification of the memory cell data are carried out by the sense amplifier;

(3) write: the cycle in which writing into memory cells is carried out from the shift register through the sense amplifier and bit lines;

(4) serial input: the cycle in which the external input data applied through the data input/output terminal 1 is set in the shift register; and (5) serial output: the cycle in which the information contained in the shift register is serially outputted to the data input/output terminal 1.

Therefore, one of the above described five operation cycles is selected by the combination of the value of the 3 bit control C0, C1 and C2. The data which appears at the data input/output terminal 1 following the 3 bit control will be as follows, dependent on each designated cycle:

(1) in the case of row address set: serial input of row address. If the memory cell array has the capacity of 1M bits and the number of word lines is 1024 ( $=2^{10}$), then 10 bits are required for the row address and 10 clocks are required.

(2) and (3) in the case of read/refresh and write cycle: only the control input cycle is carried out and there is no relation with the data input/output.

(4) in the case of serial input: the input data applied to the data input/output terminal 1 are serially set in the shift register. The number of bits should be equal to the required number for setting the shift register and the corresponding number of clocks is required. For example, in the structure such as shown in FIG. 1, that is, each block comprises 256 row×1024 column, 1054 sense amplifiers are provided for the respective blocks, so that the shift register should store 1024 bits, requiring 1024 clocks.

(5) in the case of serial output: the data latched in the shift register is serially outputted in order from the first bit through the data output buffer 6 and the serial/parallel conversion circuit 10 to the data input/output terminal 1 successively. Therefore, in the case such as shown in FIG. 1, 1024 clocks are required as in the above described case (4), in order to read the selected data of one row (1024 bits).

As described above, the actual memory operation is carried out by incorporating five operation cycles constituted by the operation cycles (1) to (5); however, the block access memory structured as described above has the following disadvantages.

In the above described conventional block access memory, the memory operation is basically carried out by using one row of memory cells (block unit) as a unit (in the conventional block access memory shown in FIG. 1, 1024 bit serial input/output), and 1024 sense amplifiers are simultaneously activated for the selected one word line, so that an extremely large peak current flows as the bit lines are charged/discharged. This large peak current causes noise and leads to an error due to the fluctuation of the substrate potential and so on.

In order to avoid the error due to the above described large peak current, a method is known in which the number of the row decoder is increased and the word lines are divided so that the number of the sense amplifiers activated corresponding to one word line can be reduced. However, this method increases the chip area due to additional row decoders, so that it is not advantageous in increasing memory capacity. In addition, since it takes much time for inputting/outputting data serially, it is not suited for serial accessing.

As described above, in a conventional block access memory, the information contained in the memory cells connected to the selected one word line is read or written at one time, so that the sense amplifiers provided corresponding to the bit lines for one row are simultaneously activated, causing a large peak current associated with charge/discharge of the bit lines.

The structure in which data transfer is carried out simultaneously between the memory cells of one row of the RAM and the shift register is disclosed in R. O. Berg, U.S. Pat. No. 4,044,339 entitled "Block Oriented Random Access Memory", F. H. Dill et al., U.S. Pat. No. 4,541,075 entitled "Random Access Memory Having a Second Input/Output Port" and R. Pinkham et al., "A High Speed Dual Port Memory with Simultaneous Serial and Random Mode Access for Video Applications", IEEE Journal of Solid-State Circuits Vol. SC-19, No. 6, December 1984. In the above mentioned prior art, the improvement in the data transfer rate is effected by the simultaneous transfer of the data for one row using a shift register; however, since the sense amplifiers of one row are simultaneously activated, there is another disadvantage that the peak current is large which flows when the sense amplifiers are activated. No means is disclosed in the prior art to solve this problem.

SUMMARY OF THE INVENTION

An object of the present invention is to eliminate the above described disadvantages of the conventional block access memory and to provide a method for driving a word line of the block access memory which is capable of reducing peak current while suppressing the increase of the chip area.

In the block access memory in accordance with the present invention, each blocks are further divided into a plurality of subblocks and the timing for activating the word line and the timing for activating sense amplifiers in each subblock in that block selected by the external address are made different from each other.

According to the present invention, since the timing for activating the word lines and the timing for activating the sense amplifiers are different from each other in the plurality of subblocks in the selected block, so that the number of sense amplifiers which are activated at one time is reduced, whereby the peak current associated with the charge/discharge of the bit lines at the time of activating sense amplifiers can be suppressed and the errors due to the fluctuation of the substrate potential and so on can be prevented.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram of waveforms of the signals for describing the operation of the conventional block access memory;

FIG. 3 shows the relation between the operation cycle carried out by the conventional block access memory and the control designating the operation cycle;

FIG. 7 is a diagram of waveforms of the signals showing the operation in data reading of the block access memory in accordance with one embodiment of the present invention.

DESCRIPTION OF THE PREFERRED EMBODIMENTS

Figure 1:
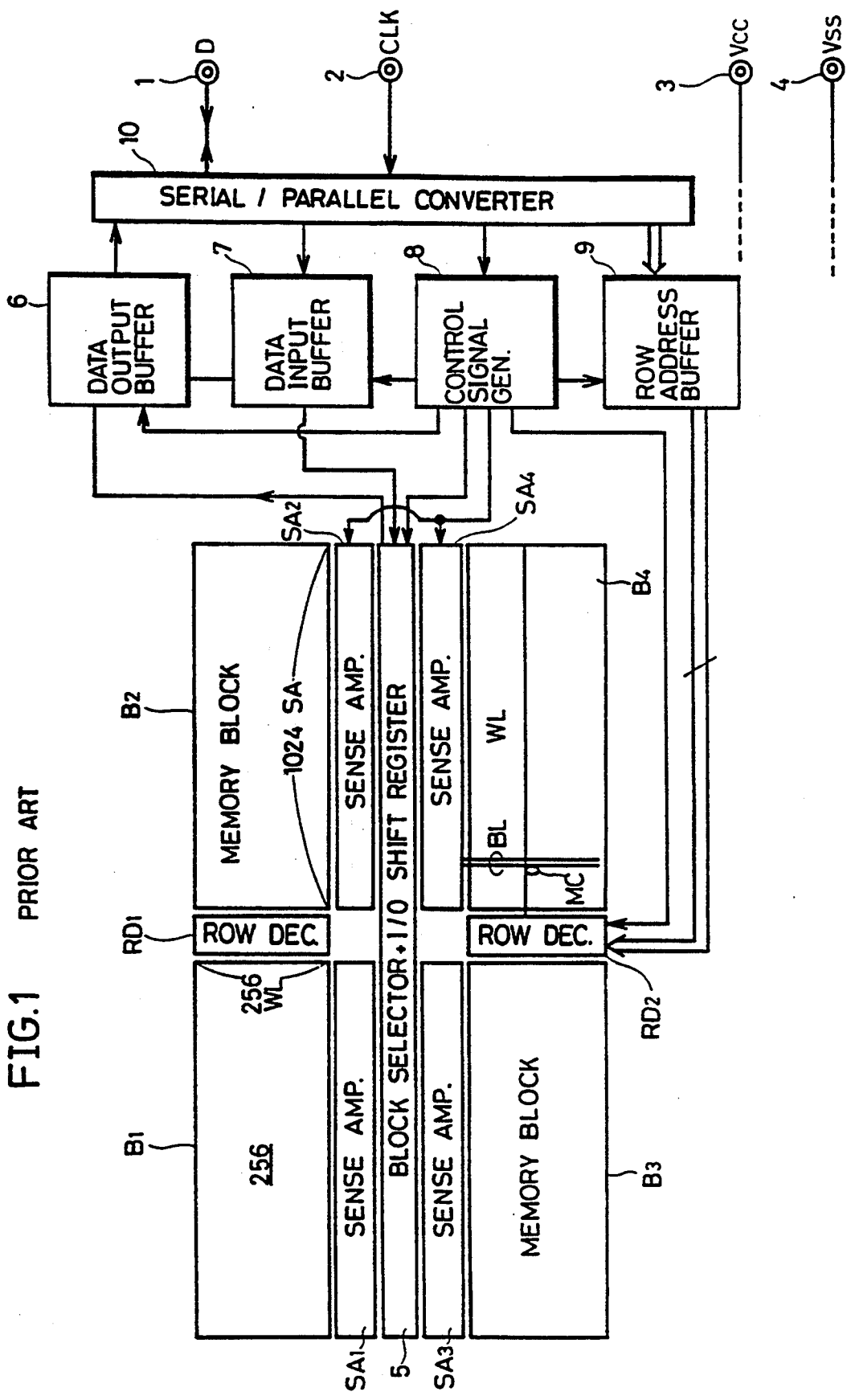
FIG. 1 is a schematic block diagram showing the whole structure of a conventional block access memory.
Figure 4:
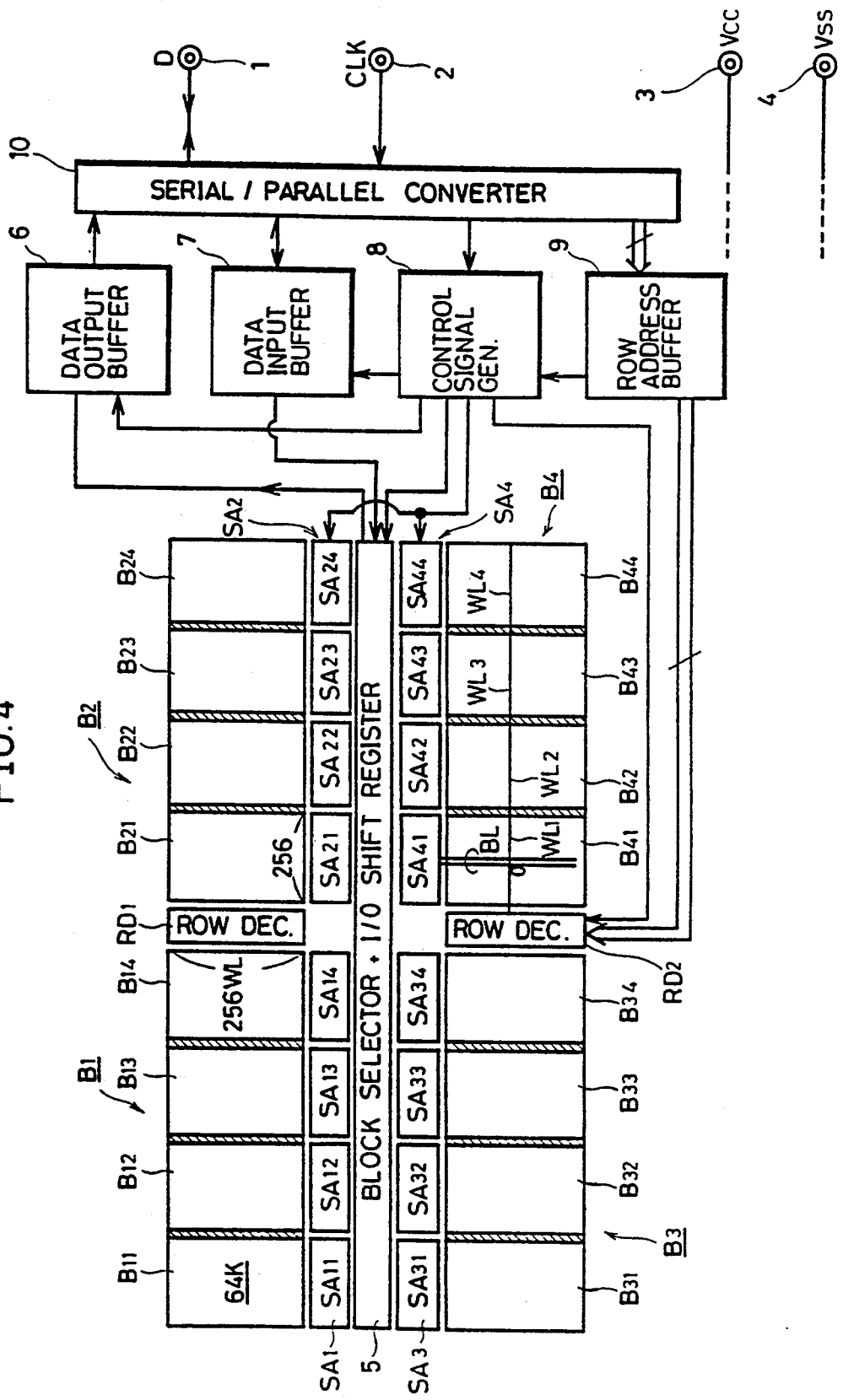
FIG. 4 is a schematic diagram showing the whole structure of a block access memory in accordance with one embodiment of the present invention.

FIG. 4 is to illustrate the word line driving method of the block access memory in accordance with one embodiment of the present invention, showing the schematic structure of the block access memory. The block access memory of FIG. 4 is different from the conventional one shown in FIG. 1 in that each of the memory blocks B1 to B4 is divided into subblocks B11 to B14, B21 to B24, B31 to B34 and B41 to B44 so as to divide one word line in a block. In FIG. 4, a structure is shown as an example in which one subblock has the capacity of 64K bits and has 256 row×256 column structure. Each of the sense amplifiers SA1 to SA4 is divided respectively in correspondence to each subblock. Namely, the sense amplifier SA1 is divided into four sense amplifier groups SA11, SA12, SA13 and SA14. The sense amplifier group SA2 is divided into sense amplifier groups SA21, SA22, SA23 and SA24. The sense amplifier group SA3 is divided into the sense amplifier groups SA31, SA32, SA33 and SA34. The sense amplifier group SA4 is divided into the sense amplifier group SA41, SA42, SA43 and SA44.

Various structures can be employed as the block selector +I/O shift register 5. More specifically, the shift register may be provided to be divided correspondingly to the sense amplifiers of each subblock and the shift registers corresponding to the respective subblocks may be successively activated by the block selector. On this occasion, as for the input/output data to and from the shift register, the operation timing of a switching transistor (not shown) between the I/O bus (not shown) which is the data input/output line and each of the shift registers should be controlled so that the output data from each subblock or the input data to each subblock is serially read or written successively. Alternatively, the shift register may be divided into the block unit only as in the conventional case, and the data may be transferred between the sense amplifiers and the shift register by the block unit at one time and simultaneously by changing the timing of activating the sense amplifiers in the subblock.

Figure 5:
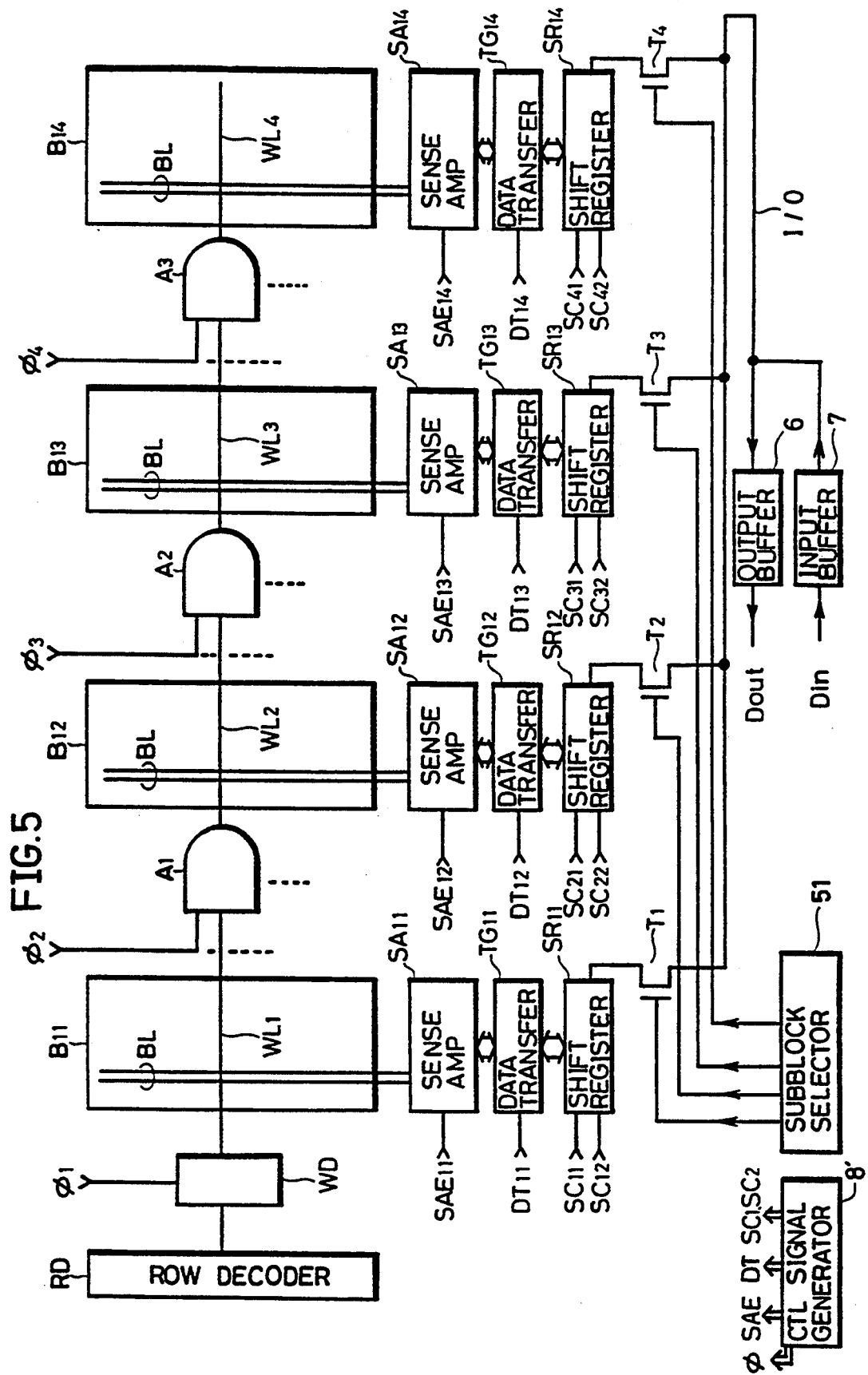
FIG. 5 is a block diagram showing more specifically the structure of a main portion of the block access memory in accordance with one embodiment of the present invention.

FIG. 5 shows the structure of the driving portion of one word line in a subblock contained in one block (in the figure, block B1). As shown in FIG. 5, one word line WL is divided into the subword lines WL1, WL2, WL3 and WL4 corresponding to the subblocks. A word driver WD is provided between the row decoder RD and the subword line WL1 which receives the output of the row decoder RD and the word line activating driving signal $\phi 1$ and activates the selected word line. An AND gate A1 is provided between the subword line WL1 in the subblock B11 and the subword line WL2 in the subblock B12 which receives the output of the word driver WD at its one input and receives a word line driving signal φ2 at the other input which is generated delayed from the word line driving signal φ1 by a predetermined time period. An AND gate A2 is provided between the subword line WL2 in the subblock B12 and the subword line WL3 in the subblock B13 which receives the output of the AND gate A1 at its one input and receives a word line driving signal φ3 which is generated delayed from the word line driving signal φ2 by a predetermined time period at its the other input. An AND gate A3 is provided between the subword line WL3 in the subblock B13 and the subword line WL4 in the subblock B14 which receives the output of the AND gate A2 at its one input and receives a word line driving signal φ4 which is generated delayed from the word line driving signal φ3 by a predetermined time period at its the other input.

Namely, in this structure, when one word line is selected by the output of the row decoder RD, the subword line WL1 is activated by the word driver WD in response to the word line driving signal φ1, and thereafter, the subword line WL2 is activated in response to the state in which the subword line WL1 is in the active state and the word line driving signal φ2 is activated. In this manner, the subword line WL3 in the subblock B13 and the subword line WL4 in the subblock B14 are successively activated. The word line driving signals φ1 to φ4 are generated from a control signal generator 8'.

In FIG. 5, although the structure of one word line in the subblocks B11 to B14 is illustrated, the structure is common to other blocks B2 to B4 and AND gates A1 to A3 are provided corresponding to each word line.

The sense amplifiers and the shift registers are also divided into subblocks so as to correspond to each subblock. Namely, a sense amplifier SA11 which is activated in response to the sense amplifier activating signal SAE11 and a shift register SR11 which latches and shifts the input data in response to the clock signals SC11 and SC12 are provided for the subblock B11. A sense amplifier SA12 which is activated in response to the sense amplifier activating signal SAE12 and a shift register SR12 which latches and shifts the data in response to the clock signals SC21 and SC22 are provided for the subblock B12. A sense amplifier SA13 which is activated in response to the sense amplifier activating signal SAE13 and a shift register SR13 which latches and shifts the data in response to the clock signals SC31 and SC32 are provided for the subblock B13. A sense amplifier SA14 which is activated in response to a sense amplifier activating signal SAE14 and a shift register SR14 which latches and shifts the data in response to the clock signals SC41 and SC42 are provided for the subblock B14.

A data transfer gate TG11 is provided between the sense amplifier SA11 and a shift register SR11, which turns on in response to the data transfer signal DT11 and provides a data transfer path between the sense amplifier SA11 and a shift register SR11.

A data transfer gate TG 12 is provided between the sense amplifier SA12 and a shift register SR12, which turns on in response to the data transfer signal DT12 and provides a data transfer path between the sense amplifier SA12 and a shift register SR12.

A data transfer gate TG13 is provided between the sense amplifier SA13 and a shift register SR13, which turns on in response to the data transfer signal DT13 and provides a data transfer path between the sense amplifier SA13 and a register SR13.

A data transfer gate TG14 is provided between the sense amplifier SA14 and a shift register SR14, which turns on in response to the data transfer signal DT14 and provides a data transfer path between the sense amplifier SA14 and a shift register SR14.

Subblock selection transistors T1, T2, T3 and T4 are provided between each of the shift registers and the data input/output bus I/O, which successively turn on in the predetermined order under the control of the subblock selector 51. Each shift register has its input and output connected together, and it performs data transfer to the data output buffer 6 or from the data input buffer 7 through the corresponding subblock select transistor.

The generation of various control signals for the data output buffer 6 and the data input buffer 7 is carried out by the control signal generator 8'.

Figure 6:
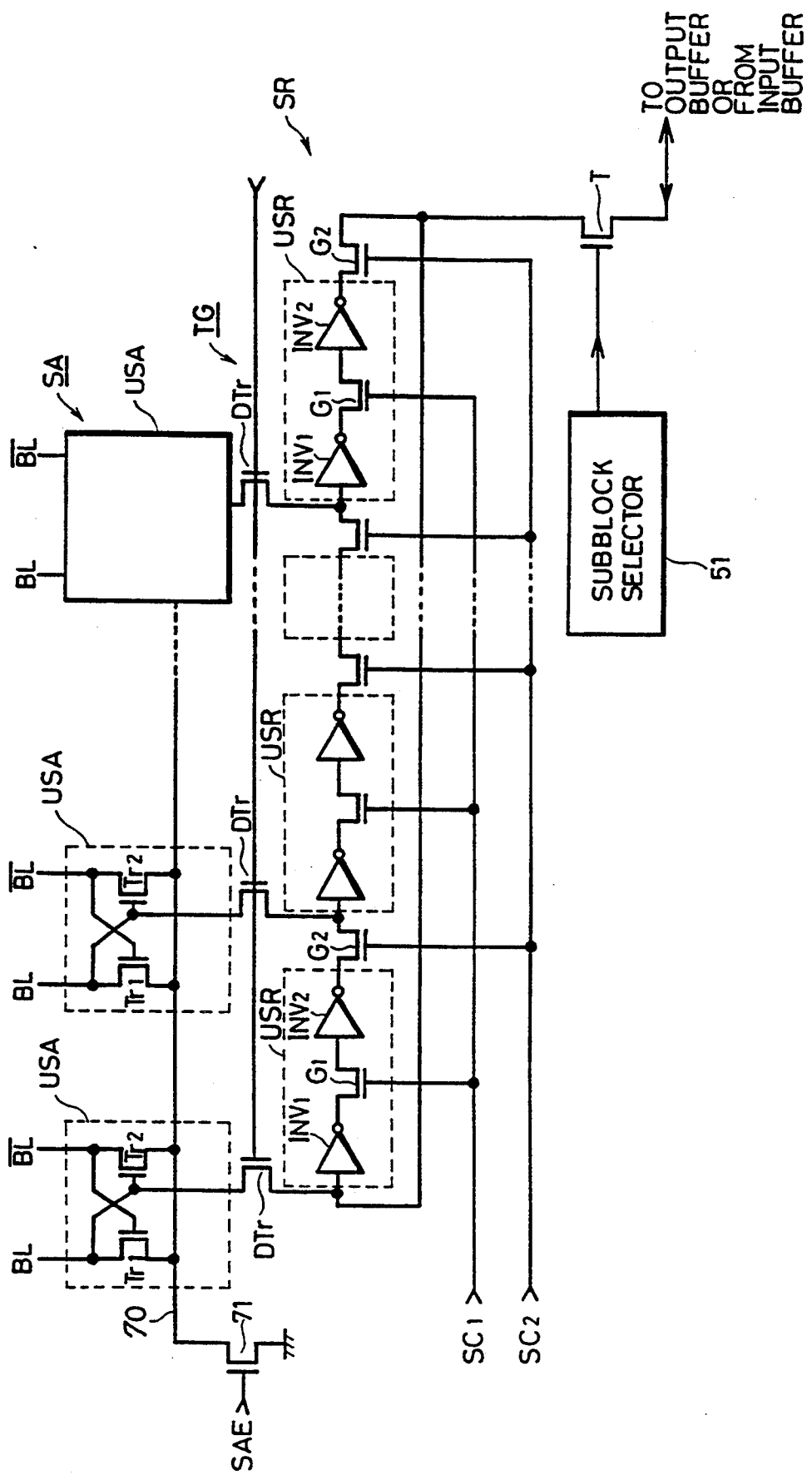
FIG. 6 shows one example of the structure of the data input/output portion of one subblock in the block access memory in accordance with one embodiment of the present invention.

FIG. 6 shows one example of a specific structure of the sense amplifier, the data transfer gate and the shift register in one subblock out of the subblock structure shown in FIG. 5.

Referring to FIG. 6, the sense amplifier SA comprises unit sense amplifiers USA each of which is provided corresponding to the bit line pair BL and $\overline{BL}$. If the subblock has 256 columns, 256 unit sense amplifiers are provided. The unit sense amplifier USA is constituted by two transistors Tr1 and Tr2 which have their gates and drains cross-connected. The sense amplifier activating signal line 70 is connected to the ground potential through a transistor 71 which turns on in response to the sense amplifier activating signal SAE.

The shift register SR is constituted by cascade connected unit shift registers USR. Each unit shift register USR comprises a first inverter INV1, a transistor G1 which is connected to the output portion of the first inverter INV1 and turns on in response to the clock signal $SC_1$ ( $=SC_{n1}$; n=1,2,3,4), and a second inverter INV2 to which the transistor G1 is connected at the input portion. A transistor G2 is provided between adjacent unit shift registers which turns on in response to the clock signal $SC_2$ ( $=SC_{n2}$; n=1,2,3,4).

The shift register SR carries out the data transfer with the memory cells of one row in the subblock, so that if one row in the subblock has 256 bits, then 256 stages of unit shift registers USR are connected. The input portion of the unit shift register USR in the first stage and the output portion of the unit shift register in the last stage are connected to each other through the transistor G2. The clock signal $SC_1$ provides the timing for data latch in the unit shift register USR and the clock signal $SC_2$ provides the timing for data shift in each unit shift register USR. Each of the clock signals $SC_1$ and $SC_2$ is generated in response to the rise and fall of the external basic clock signal CLK.

The data transfer gate TG is constituted by transistors DTr each provided between each unit sense amplifier USA and the input of each unit shift register USR and turns on in response to the data transfer signal DT. One conduction terminal of each transistor DTr is connected to the gate of one transistor (transistor Tr2 in FIG. 6) in the corresponding unit sense amplifier USA. Therefore, the data transfer between the selected row of memory cells and the shift register is carried out through each unit sense amplifier.

FIG. 7 is a diagram of waveforms showing the data reading operation in the block access memory employing the word line driving method according to the present invention. In FIG. 7, the waveforms of the reading operation in two subblocks B11 and B12 only are shown in order to simplify the drawing.

The data reading operation will be hereinafter described with reference to FIGS. 4 to 7.

First, in the similar manner as in the conventional case, an external row address is serially applied to the data input/output terminal 1 subsequent to the control designating the row address set. The external row address is simultaneously applied to the row address buffer 9 through the serial/parallel conversion circuit 10. The row address buffer 9 generates a set of internal row addresses (for example complementary address signal pair) corresponding to the applied external row address and applies the same to the row decoders RD1 and RD2. Consequently, one of the 1024 unit row decoders (in the case where one block is constituted by 256 rows, 256×4=1024) included in the row decoders RD1 and RD2 is selected and activated. The subword line WL1 in the subblock B11 is activated by the output of the word driver WD in response to the output of the selected unit row decoder and to the word line driving signal $\phi 1$ which is generated from the control signal generator 8' at a prescribed timing, and the potential on the subword line WL1 rises. The data in the memory cells connected to the word line WL1 is read to the bit lines BL and $\overline{BL}$ and the potentials on the bit lines BL and $\overline{BL}$ are established, and thereafter the sense amplifier SA11 provided corresponding to the subblock B11 is activated in response to the sense amplifier activating signal SAE11 which is generated under control of the control signal generator 8'. Consequently, the potential on each bit line is established to be high level or low level dependent on the information stored in the memory cell connected to the selected subword line WL1. Thereafter, all transistors DTr of the data transfer gate DG11 turn on in response to the data transfer signal DT11 from the control signal generator 8' and the information which is amplified by the sense amplifiers is transferred to the shift register SR11 at one time. The shift register SR11 carries out the shifting operation in response to the clock signals SC11 and SC12 from the control signal generator 8'. Consequently, the data is transferred serially to the data output buffer 6 through the transistor T1 which is in the on state in response to the signal from the subblock selector 51 and the serial data is outputted therethrough. During the serial reading operation of the data in the subblock B11, the word line driving signal $\phi 2$ is generated from the control signal generation circuit 8' with a prescribed delay time from the word line driving signal $\phi 1$ and becomes high level. Now, the subword line WL1 is at high potential due to the output of the word driver WD, so that the potential of the subword line WL2 rises due to the AND gate A1. By the rise of the potential on the subword line WL2, the information contained in the memory cells connected to the subword line WL2 is transmitted to each bit line. When the potential on the bit line is established, the sense amplifier activating signal SAE12 is generated from the control signal generation circuit 8', the sense amplifier SA12 which corresponds to the subblock B12 is activated and the potential on the bit line in the subblock B12 is established to be high level or low level dependent on the read information. After the amplifying operation by the sense amplifier SA12, a data transfer signal DT12 is applied to the data transfer gate TG12 from the control signal generation circuit 8' and the data in the subblock B12 is transferred to the shift register SR12. Subsequent to the completion of the data transfer from the shift register SR11 in the subblock B11, clock signals SC21 and SC22 are applied to the shift register SR12 in response to the 257th clock signal CLK and the data from the 257th bit is applied to the data output buffer 6 by the shift register SR12 through the transistor T2 which turns on under the control of the subblock selector 51. Consequently, the data following the 257th bit is serially outputted continuously following the 256 bit serial data from the shift register SR11.

Similar operation sequence is carried out for the subblocks B13 and B14. Naively, during the sequential output operation of the data in the subblock B12, the word line driving signal $\phi 3$ from the control signal generation circuit 8' becomes high level and the potential on the subword line WL3 becomes high level by means of the AND gate A2. Thereafter, the sense amplifier activating signal SAE13 becomes high level and the sense amplifier SA13 is activated. The data which is amplified in the sense amplifier SA13 is transferred to the shift register SR13 through the data transfer gate TG13 which turns on in response to the data transfer signal DT13. Thereafter, subsequent to the reading of the data from the subblock B12, the data in the subblock B13 is serially read through the transistor T3 which turns on under the control of the shift register SR13 and the subblock selector 51 in response to the clock signals SC31 and SC32. During the serial reading operation of the data in the subblock B13, the word line driving signal $\phi 4$, the sense amplifier activating signal SAE14 and the data transfer signal DT14 successively rise under the control of the control signal generation circuit 8' and the information contained in the memory cells connected to the subword line WL4 in the subblock B14 is transferred to the shift register SR14. The shift register SR14 carries out the shifting operation in response to the clock signals SC41 and SC42 from the control signal generation circuit 8' after the serial reading of the data in the subblock B13 and, consequently, the data in the subblock B14 is serially read following the serial data from the subblock B13. Consequently, the data for one row in the selected block B1 is serially read through the data output buffer 6 continuously.

Although the timing for the data transfer to the shift register is different from each other in each subblock in the above described embodiment, the timing for the data transfer may be the same for all subblocks and the shift timing only is made different for each subblock.

Although the timings of the completion of the active state of the word lines in each subblock are the same and the period of the active state of the subword lines in each subblock are different from each other in the above described embodiment, the "H" level period can be made equal to each other for each subword line by directly applying the output of the word driver WD to one input of the AND gates A1 to A3 and by controlling the "H" level period of the subword lines WL1 to WL4 by the clock signal $\phi 1$ to $\phi 4$.

As described above, in the selected block, the potential of the subword lines rises sequentially and the sensing operation is carried out with a prescribed delay between each of the subblocks included in the selected block, so that the charge/discharge current of the bit line incidental to the sensing operation is dispersed, thereby suppressing the peak current.

Although the description was made of the case in which the data in the memory cell is read in the above described embodiment, the same can be applied to the data writing operation. In this case also, the timing of the rise of the subword line in each subblock differs from each other and the timing of activating sense amplifiers differs from each other, so that the charge/discharge current on the bit lines is dispersed, thereby suppressing the peak current.

The word line driving signal φn of each subblock may be generated after a prescribed time period from the word line driving signal φ (n−1) for the subblock of the preceding stage by providing a delay circuit (having a predetermined delay time). The word line driving signal of the succeeding subblock may be generated upon receipt of the completion of the sensing operation in the subblock of the preceding stage. In that case, the sense amplifier activating signal for activating the sense amplifier provided corresponding to each subblock may be generated in the similar manner.

Even if the word line driving signal of the subblock of the succeeding stage is made to be generated upon receipt of the completion of the sensing operation of the subblock of the preceding stage, there is no influence on the serial operation. More specifically, in such structure that shift registers are provided being divided into subblocks corresponding to each sense amplifier (provided corresponding to the subblocks) and the timing for data transfer for each subblock is different from each other, if the word line driving signal of the subblock of the succeeding stage is generated after the sensing operation of the subblock in the preceding stage is completed and the serial data input/output in the subblock of the preceding stage has begun in the worst case, it can be ready for the serial input/output of the data following the 257th bit in successively inputting/outputting data serially. The reason for this is that the serial input/output of 256 bit (in the example of FIG. 4) data is carried out for one subblock and assuming that 10 nS time is required for 1 bit, there is still a time margin of about 2 μs, so that there is sufficient margin even if the time required for the rise of the subword line, the time required for the sensing operation and the time required for the data transfer to the shift register through the sense amplifier or from the shift register to the sense amplifier are all taken in consideration. As for the method for generating the word line driving signal in each subblock, any method may be employed provided that the signal is generated with a predetermined delay time from the word line driving signal of the subblock in the preceding stage. Namely, a purpose of the present invention is to suppress the peak current without affecting the data transfer rate by using the time required for inputting/outputting data serially and driving the subblocks in the succeeding stages successively during that time period.

Although the description was made of a case in which the timing of activating the subword line selected in each subblock differs from each other in the above embodiment, the same effect can be obtained even if the selected word lines of the subblocks are simultaneously activated and only the timing of activating the sense amplifiers corresponding to each of the subblocks is made different from each other. The area occupied by the AND gate which is required for the logical product of the word line driving signal φn and the signal on the subword line WL (n−1) for successively driving the subword lines in each of the subblocks is very small so that it hardly influences the increase of the chip area.

In addition, although the description was made of a memory of ×1 bit structure in which only one block is accessed at one time in the above embodiment, the present invention may be applied to the memory of ×n structure in which a plurality of (for example n) blocks are accessed at one time.

As described above, according to the present invention, the memory blocks in the block access memory are further divided into a plurality of subblocks, the timing for activating the word line in each subblock are made different from each other and the timing for activating the sense amplifier in each subblock is made different from each other in response, so that the increase of the chip area can be suppressed to the minimum and driving of the word line which is suitable for the serial input/output of the data becomes possible without affecting the transfer rate of the data, whereby the number of the sense amplifiers which are to be activated at one time can be suppressed and the peak current at selecting the word line can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a memory cell array having a plurality of memory cells arranged in rows and columns, each of said memory cells storing information, and said memory cell array divided into a plurality of blocks wherein said memory cells of said memory cell array are accessed by a respective one of said blocks, a method of accessing said memory cell array during one of either a reading and a writing operation comprising the steps of:

dividing each of said plurality of blocks into a plurality of subblocks having a common word line, said word line segmented into portions corresponding to each of said subblocks;

selecting one word line which designates one row in a selected one of said blocks responsive to an externally applied address signal;

successively activating all said segmented portions of said selected word line within each subblock containing the selected word line whereby each segmented portion is activated at a different time; and activating a sense amplifier which detects, amplifies and latches the information of each of said columns of memory cells in response to the portion of the selected word line being activated in a respective subblock, whereby the timing for activating the sense amplifier in each subblock is made different from each other.

2. A block access memory comprising a plurality of memory blocks constituted by a plurality of memory cells arranged in rows and columns each of said memory cells for storing information therein, wherein said memory cells are arranged in corresponding blocks of said memory cells and access to and from said memory cells for data input/output is responsive to designation of a corresponding block of said memory cells, said block access memory further comprising:

a plurality of subblocks provided in each of said plurality of blocks;

word line selection means for generating a selection signal designating a word line corresponding to a row in one block of said plurality of blocks in response to an externally applied address signal;

means for successively activating all of a predetermined number of segments of the selected word line during one of either a reading and a writing operation wherein each of said segments correspond to a respective one of said subblocks, each of said segments activated to the exclusion of other segments of said selected word line and in response to the output of said word line selection means; and means for activating a sense amplifier corresponding to a selected segment of said selected word line so that a sense amplifier which detects, amplifies and latches the information on each column is activated after the selected segment of the selected word line is activated in each subblock of the block in which the selected word line is included.

3. The memory according to claim 2, wherein said means for selectively activating predetermined segments of the selected word line successively activates each of said predetermined segments for providing a data output from said block access memory.

4. A method of accessing a memory cell array having a plurality of memory cells arranged in rows and columns, each of said memory cells storing information, said memory cell array divided into a plurality of blocks wherein said memory cells of said memory cell array are accessed by a respective one of said blocks, comprising the steps of:

dividing each of said plurality of blocks into a plurality of subblocks having a con, on word line, said word line segmented into portions corresponding to each of said subblocks;

selecting one word line which designates one row in a selected one of said blocks responsive to an externally applied address signal;

successively activating all said segmented portions of said selected word line within each subblock containing the selected word line whereby each segmented portion is activated at a different time; and activating a sense amplifier which detects, amplifies and latches the information of each of said columns of memory cells in response to the portion of the selected word line being activated in a respective subblock, whereby the timing for activating the sense amplifier in each subblock is made different from each other, wherein both input data and output data are serially supplied to and from a designated block of said memory cell array.

* * * * *